United States Patent [19]

Chisholm

[11] 4,365,398

[45] Dec. 28, 1982

[54] METHOD OF AND APPARATUS FOR ASSEMBLING INTERMEDIATE-WEB HELD TERMINAL PINS

[75] Inventor: William M. Chisholm, Midlothian, Va.

[73] Assignee: Western Electric Company, Inc., New York, N.Y.

[21] Appl. No.: 174,061

[22] Filed: Jul. 31, 1980

Related U.S. Application Data

[62] Division of Ser. No. 965,219, Nov. 30, 1978, Pat. No. 4,265,508.

[51] Int. Cl.³ ........................ H05K 3/00; B23P 23/00
[52] U.S. Cl. .................................... 29/845; 29/564.6; 29/739
[58] Field of Search ..................... 29/842, 564.6, 739, 29/747, 845; 113/119

[56] References Cited

U.S. PATENT DOCUMENTS

| | | |
|---|---|---|
| 2,871,551 | 2/1959 | Harris . |
| 3,429,039 | 2/1969 | Berg ..................................... 29/739 |
| 3,550,250 | 12/1970 | Cervenka et al. . |
| 3,605,237 | 9/1971 | Bakermans . |
| 3,664,015 | 5/1972 | Bakermans . |
| 3,676,926 | 7/1972 | Kendall . |
| 3,765,075 | 10/1973 | Olney, Jr. et al. . |
| 3,769,679 | 11/1973 | Kendall . |
| 3,805,356 | 4/1974 | Serrano . |
| 3,946,477 | 3/1976 | Cobaugh et al. . |
| 4,035,047 | 7/1977 | Ammon . |
| 4,087,906 | 5/1978 | Cobaugh et al. . |
| 4,211,001 | 7/1980 | White et al. ......................... 29/747 |
| 4,218,580 | 8/1980 | Chisholm ........................ 29/747 X |

Primary Examiner—Carl E. Hall
Assistant Examiner—Carl J. Arbes
Attorney, Agent, or Firm—D. D. Bosben

[57] ABSTRACT

Terminal pins (18) in a terminal pin strip (16) are integrally interconnected by webs (22) located intermediate free insertion ends (18i) and free connector ends (18c) of the pins so that when the webs are severed to separate the terminal pins, the severing operation does not disrupt the integrity of smooth finished surfaces on the connector ends of the pins. Each terminal pin (18) also is formed with an intermediate push shoulder (18ps) for applying pressure on the pin to insert the pin into an aperture (20a) in a support structure, such as a printed wiring board (20), without damaging the connector end (18c) of the pin. Assembly of the terminal pins (18) into the printed wiring board (20), utilizing terminal pin strips (16) on respective supply reels (24), is accomplished with apparatus comprising a pair of pin transporter mechanisms (26), a pair of web-severing punch-and-die mechanisms (28), and a pin insertion mechanism 30.

10 Claims, 13 Drawing Figures

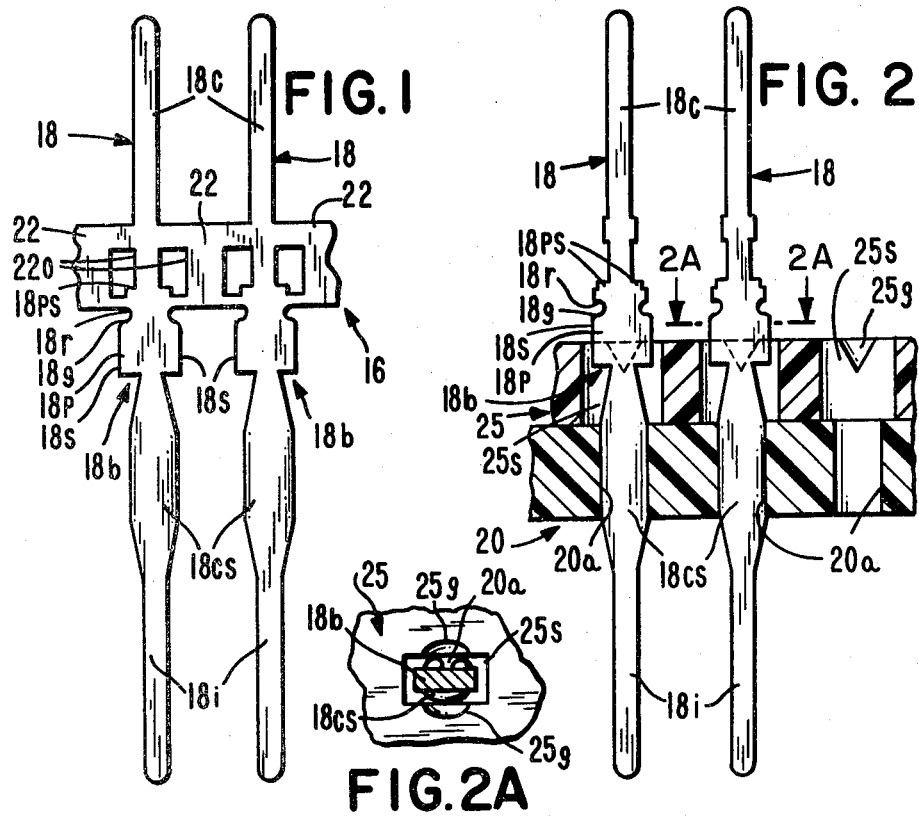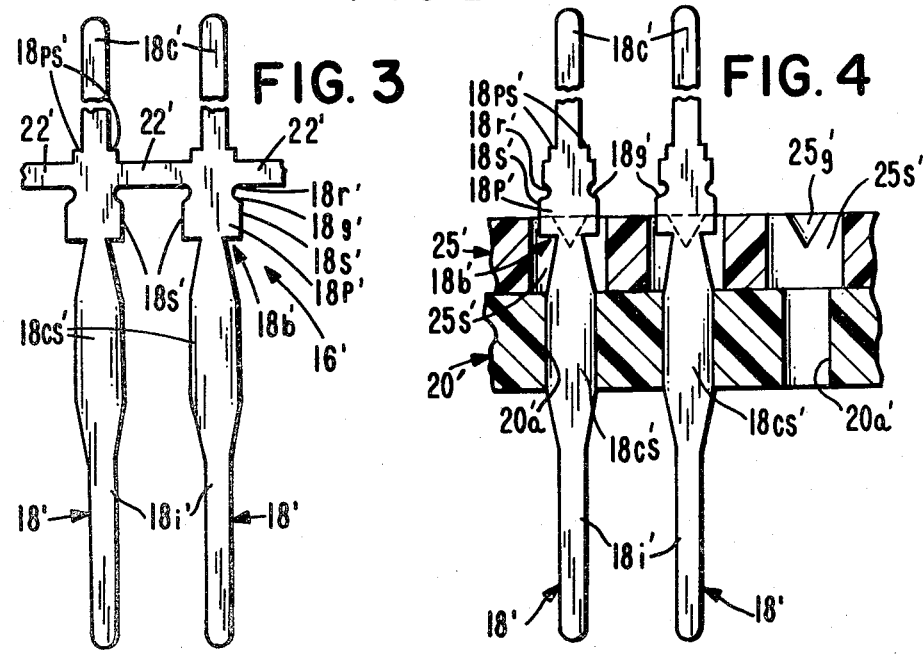

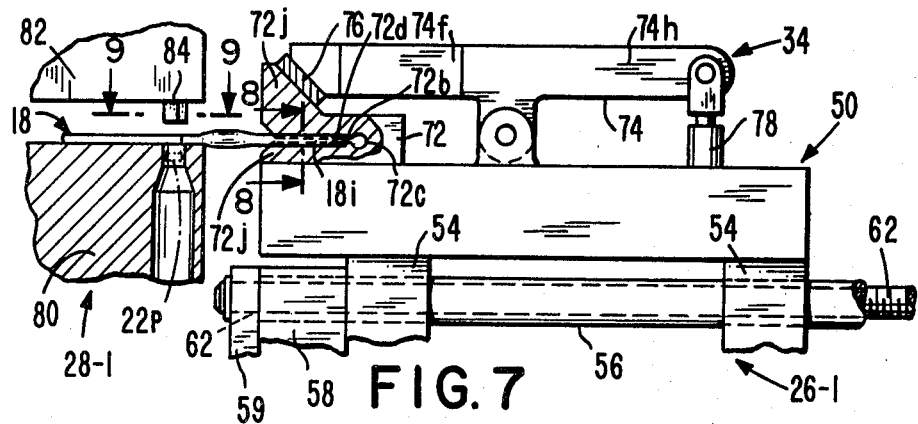
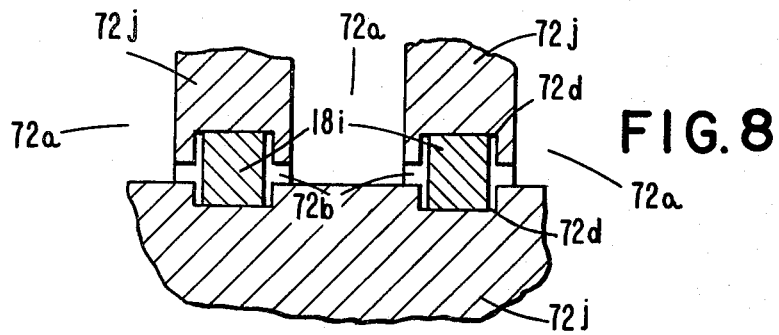
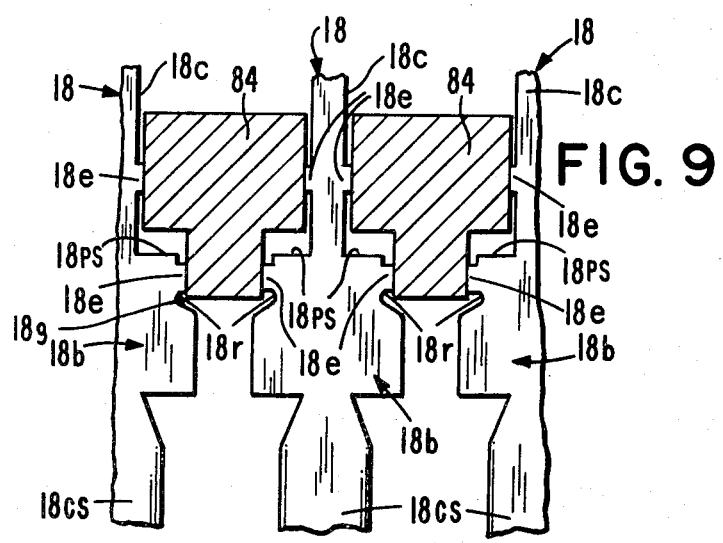

METHOD OF AND APPARATUS FOR ASSEMBLING INTERMEDIATE-WEB HELD TERMINAL PINS

This is a division of application Ser. No. 965,219 filed Nov. 30, 1978, now U.S. Pat. No. 4,265,508.

TECHNICAL FIELD

This invention relates to intermediate-web held terminal pins, including a method of and apparatus for assembling the pins with a support structure, and more specifically to intermediate-web held terminal pins which can be separated from one another and assembled to a support structure without disrupting the integrity of smooth finished surfaces on connector ends of the pins.

BACKGROUND OF THE INVENTION

In the manufacture of electronic communications apparatus it is standard practice to utilize elongated terminal pins formed with insertion ends which are inserted into a support structure, such as a printed wiring board, and opposite connector ends which subsequently are received in a connector device. For maximum use and versatility it is essential that the connector ends of the terminal pins maintain their structural integrity and provide a smooth finished surface for reception in the connector device. Thus, it is important that the connector ends of the terminal pins not be scratched, deformed or otherwise damaged during the assembly operation.

In the assembling of these terminal pins in apertures in a printed wiring board, it is known practice to insert the insertion ends of the pins into the apertures in the printed wiring board by exerting pressure on the connector ends of the pins. This is undesirable because the pressure on the connector ends of the terminal pins tends to damage these ends whereby they subsequently cannot be properly inserted in a connector device.

It also is known to form terminal pins from sheet stock in a parallel array with opposite ends of the terminal pins interconnected by opposed parallel side rails to form a terminal strip. In an assembling operation one of the side rails is separated from insertion ends of the terminal pins and the other side rail may be used as a pusher member to insert the separated ends into apertures in a printed wiring board. After the assembling operation, the second support rail is separated from connector ends of the terminal pins. In the alternative, the second support rail may be separated from the connector ends of the terminal pins before or after the insertion of the terminal pins into the printed wiring board, with the insertion of the terminal pins into the board being accomplished utilizing push shoulders formed on intermediate portions of the pins. In any event, either method is disadvantageous because the structural integrity of the connector ends of the terminal pins is damaged or destroyed when the side rails are separated from the pins, thus making the pins unacceptable for universal use.

The T. R. Harris U.S. Pat. No. 2,871,551 (FIG. 7) discloses a terminal pin strip in which terminal pins are interconnected adjacent respective ones of their ends by a removable side rails, and intermediate their ends by a strip member which may be utilized to provide an electrical connection between two or more adjacent terminal pins. In this regard, the strip member may be severed between adjacent terminals which are not to be electrically interconnected, as desired, at the same time that the ends of the terminals are separated from the side rail.

SUMMARY OF THE INVENTION

The subject invention relates to a terminal pin strip in which a plurality of webs are formed integrally with and between intermediate portions of associated adjacent pairs of terminal pins in the strip, with at least one push shoulder being formed integrally with the intermediate portion of each pin. Thus, the webs can be severed from the terminal pins, and the push shoulders can be utilized to insert the terminal pins in a support structure, without disrupting the integrity of smooth finished surfaces on connector ends of the pins.

The integrally formed webs may have openings formed therethrough which define the shoulders and which reduce the cross-sectional area of the webs adjacent the terminal pins to facilitate separation of the webs from the terminal pin. The terminal pins also may include blade portions having inclined guide surfaces merging into parallel side edges of the blade portions. In addition, the guide surfaces may merge into recessed edge portions of the blade portions which permit separation of the webs between the terminals without damaging the guide surfaces.

In assembling the terminal pins with a support structure, such as a printed wiring board, insertion ends of a plurality of the terminal pins of the terminal strip are positioned in movement-confining portions of a pin transporter with the webs between the pins located externally of the pin transporter. The webs then are removed so that the terminal pins are retained individually in spaced relationship by the pin transporter. The pin transporter next is moved toward a pin inserter to insert connector ends of the terminal pins into movement-confining portions of the pin inserter, whereupon the pin transporter is withdrawn from the pins so that the pins are retained individually in spaced relationship by the pin inserter. Relative movement then is caused between the pin inserter and the support structure to insert the insertion end of each pin into one of the apertures in the support structure. During the insertion operation the pin inserter engages puch shoulders on the terminal pins intermediate the insertion ends and the connector ends of the pins, so as to preclude damage to the connector ends of the pins.

More specifically, the pin transporter may comprise mechanisms movable in directions perpendicular to one another for advancing the terminal pins from a continuous supply into a punch-and-die mechanism for severing the webs from between adjacent pairs of the pins, and for positioning the connector ends of the severed pins in the movement-confining portions of the pin inserter. For this purpose the pin transporter may include a pivoted clamping bar for clamping the insertion ends of the plurality of the terminal pins simultaneously. Further, the pin inserter may be a turret rotatable between a terminal pin-receiving position and a terminal pin-inserting position. Terminal pin clamping fingers are mounted on the turret for receiving the connector ends of the terminal pins and include surfaces engageable with the push shoulders on the terminal pins for inserting the insertion ends of the pins into the apertures in the support structure.

BRIEF DESCRIPTION OF THE DRAWINGS

FIG. 1 is a view of a portion of a terminal pin strip in accordance with the invention;

FIG. 2 is a view similar to FIG. 1 showing terminal pins of FIG. 1 assembled in a printed wiring board;

FIG. 2A is partial cross-sectional view taken along the line 2A—2A in FIG. 2;

FIG. 3 is an alternate embodiment of a portion of a terminal pin strip in accordance with the invention;

FIG. 4 is a view similar to FIG. 2 showing terminal pins of FIG. 3 assembled in a printed wiring board;

FIG. 7 is an enlarged cross-sectional view of a portion of the apparatus of FIGS. 5 and 6 in another operating condition, taken essentially along the line 7—7 in FIG. 5;

FIG. 8 is a cross-sectional view taken along the line 8—8 in FIG. 7;

FIG. 9 is a cross-sectional view illustrating a web-removing step in accordance with the invention and taken along the line 9—9 in FIG. 7;

DETAILED DESCRIPTION

Figure 5:
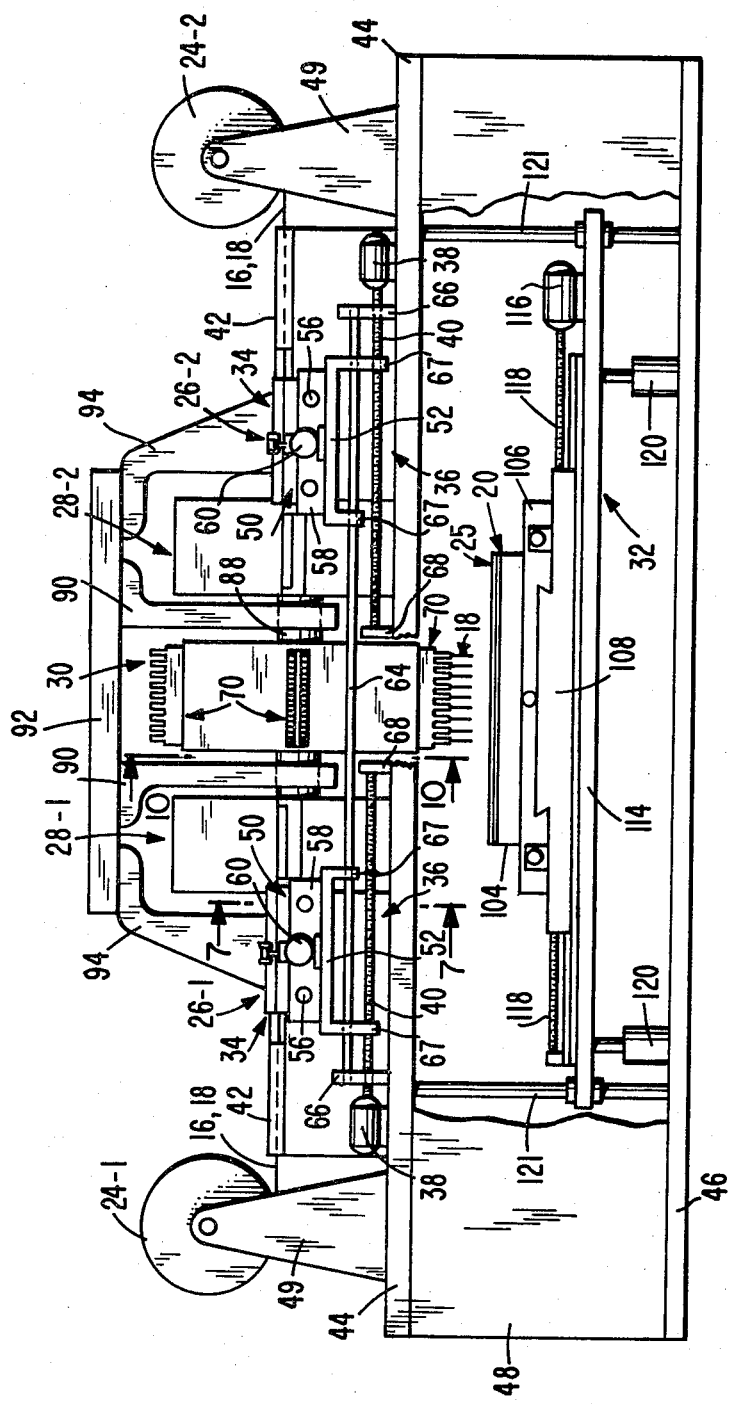
FIG. 5 is an elevational view of a terminal pin assembling apparatus in accordance with the invention, in an initial operating condition.

Referring to FIGS. 1 and 2, a terminal pin strip 16 (FIG. 1) in accordance with this invention includes a plurality of elongated terminal pins 18 each having a body comprising a free insertion end portion 18i of square cross section, hereinafter referred to as the free insertion end, which has pairs of smooth finished parallel opposite side spaced apart uniformly along the entire length of the free insertion end, the free insertion end being receivable through a circular aperture 20a (FIG. 2) in a support structure 20, such as a printed wiring board. The body of each of the terminal pins 18 also includes a free connector end portion 18c of square cross section, hereinafter referred to as the free connector end, which has pairs of smooth finished surfaces spaced apart uniformly along the entire length of the free connector end, the free connector end being receivable in snug-fitting relationship in an electrical connector device, not shown. The bodies of the terminal pins 18 are linked together intermediate their free insertion ends 18i and their free connector ends 18c by webs 22 to form the terminal pin strip 16. The terminal pin strip 16 may be formed of any suitable material, such as a copper-nickel-tin alloy. Preferably, the terminal pins 18, including the free insertion ends 18i and the free connector ends 18c, are plated with a precious metal, such as gold, while the webs 22, which are subsequently discarded as scrap, are unplated.

In FIG. 1, the webs 22 are provided with prepunched openings 22o to reduce the cross-sectional area which must be sheared during a web severing operation, thus facilitating separation of the webs from the terminal pins 18. The openings 22o also define push shoulders 18ps on planar intermediate portions of each of the terminal pins 18 in the plane of the intermediate portions, to facilitate insertion of the terminal pins into the apertures 20a of the printed wiring board 20, as shown in FIG. 2, without engaging and damaging the connector ends 18c of the pins.

The terminal pins 18 preferably include intermediate compliant sections 18cs of known type having an essentially U-shaped cross section (FIG. 2A) for retaining the terminal pins in the printed wiring board 20. The terminal pins 18 also include intermediate planar blade-type orienting or aligning portions 18b adjacent the webs 22, having opposite planar surfaces 18p and parallel side edges 18s. The blade-type orienting portions 18b also include inclined guide surfaces 18g merging into respective ones of the parallel side edges 18s. The guide surfaces 18g also merge into arcuate recessed edge portions 18r of the blade-type orienting portions 18b adjacent the webs 22, the recessed edge portions facilitating severing of adjacent sections of the webs between the terminal pins 18 without engaging and damaging the guide surfaces, as is best shown in FIG. 9. The side edges 18s and portions of the guide surfaces 18g of each terminal pin 18 are located laterally beyond respective ones of the opposite side surfaces of the free insertion end 18i and the free connector end 18c of the pin, and laterally beyond respective ones of the intermediate push shoulders 18ps, as is clearly shown in FIGS. 1, 2 and 11.

In the terminal pin insertion operation, a removable apertured plastic guide plate 25 may be suitably mounted over the printed wiring board 20, as illustrated in FIG. 2, to facilitate insertion of the compliant sections 18cs of the terminal pins 18 in the printed wiring board apertures 20a. By way of illustration, the guide plate 25 may include a series of terminal pin-receiving slots 25s with suitable guide surfaces, such as a pair of inverted conically-shaped guide grooves 25g (FIGS. 2 and 2A) located on opposite sides of each slot for guiding tips of the terminal pins 18 into alignment with the apertures 20a in the printed wiring board 20.

FIG. 3 discloses an alternate embodiment of a terminal pin strip 16' in accordance with the subject invention in which terminal pins 18' are interconnected by relatively thin strip-like webs 22', rather than by the relatively thick webs 22, with the prepunched openings 22c, of the terminal pin strip 16 of FIG. 1. In other respects, the terminal pin strip 16' of FIG. 3 is identical to the terminal pin strip 16 of FIG. 1. For example, the terminal pins 18' of FIG. 3 includes puch shoulders 18ps' on planar intermediate portions of the pins in the plane of the intermediate portions to facilitate insertion of the pins into apertures 20a' of a printed wiring board 20', as shown in FIG. 4, without engaging and damaging connector ends 18c' of the pins. The terminal pins 18' of FIG. 3 also have insertion ends 18i', intermediate compliant sections 18cs' and intermediate planar blade-type orienting portions 18b' having opposite planar surfaces 18p' and inclined guide surfaces 18g' merging into respective parallel side edges 18s' and recessed edge portions 18r'.

Figure 6:
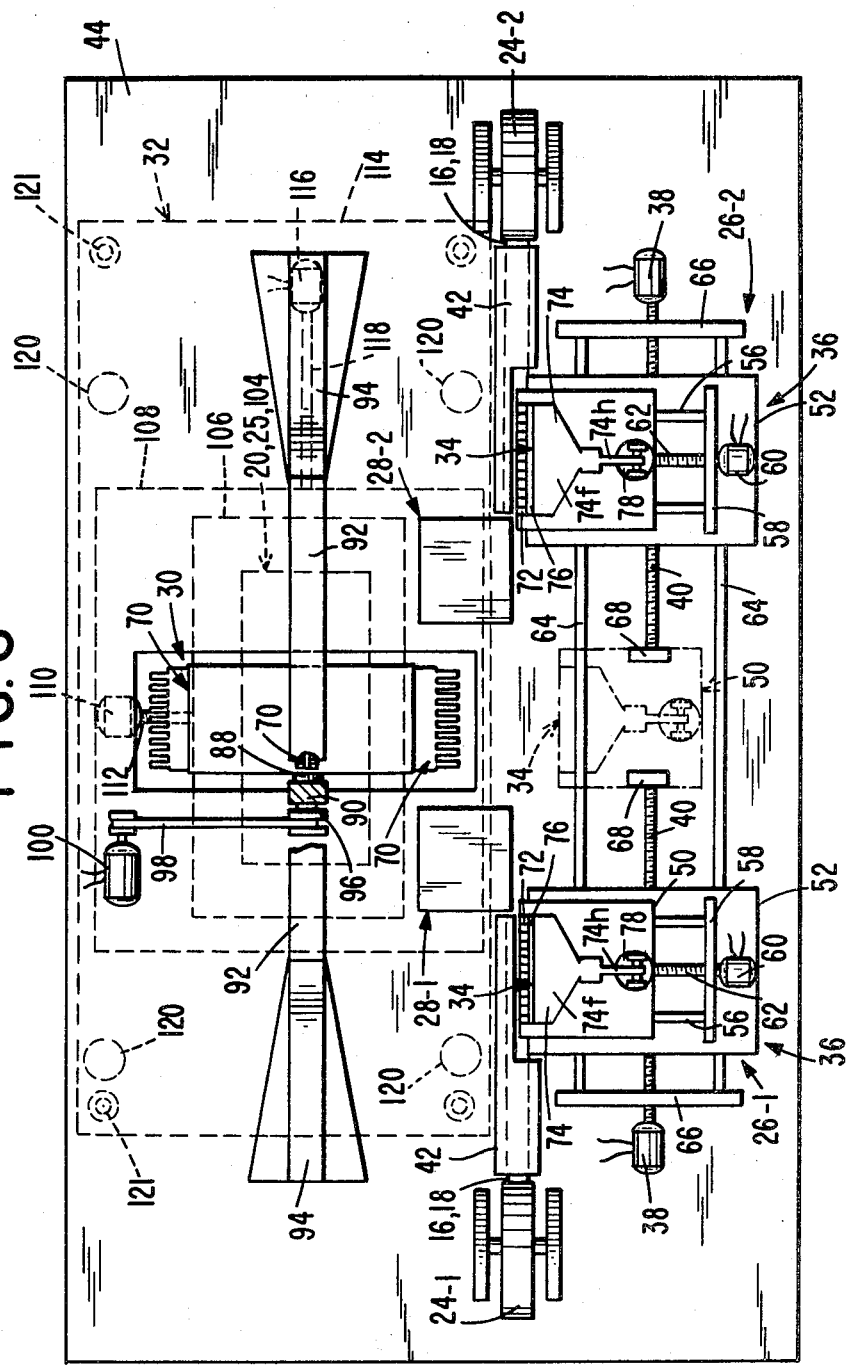
FIG. 6 is a plan view of the apparatus shown in FIG. 5.

In general, with reference to the terminal pin strip 16 of FIG. 1 by way of illustration, and referring to FIGS. 5 and 6, apparatus for assembling a plurality of the terminal pins 18 (FIGS. 1 and 2) into the printed wiring board 20 may include a pair of supply reels 24-1 and 24-2 (FIGS. 5 and 6) each having one of the terminal pin strips 16 mounted thereon. In an assembling operation the terminal pins 18 of the terminal pin strips 16 are fed alternately in sets from the supply reels 24-1 and 24-2 under the direction of a controller (not shown) by respective first and second pin transporter mechanisms 26-1 and 26-2 into associated punch-and-die mechanisms 28-1 and 28-2 for severing of the webs 22 (FIG. 1) from between the terminal pins. Each pin transporter 26-1 or 26-2 then transfers the severed terminal pins 18 to a pin insertion device 30 in the form of a rotatable turret. Upon withdrawal of the pin transporter 26-1 or 26-2 from the turret 30, the turret is rotated 90° to dispose the set of terminal pins 18 inserted therein by the pin transporter in a vertical orientation as shown in FIG. 5. The printed wiring board 20 then is moved upward by an X, Y, Z traversing mechanism 32 so that the terminal pins 18 are received in respective ones of the apertures 20a (FIG. 2) in the printed wiring board.

Since the pin transporter mechanisms 26-1 and 26-2 are essentially identical in construction and operation, only one is described herein, with like parts being identified by like reference numerals in the drawing. Thus, with reference to the first pin transporter mechanism 26-1 (FIGS. 5 and 6) by way of illustration, a set of the terminal pins 18 (FIG. 1) in the first terminal pin strip 16 extending from the first supply reel 24-1 initially is gripped by a clamping mechanism 34 of an X-Y shuttle mechanism 36. The shuttle mechanism 36 then is driven to the right in FIGS. 5 and 6 by a reversible indexing motor 38 and a drive screw 40 to locate the set of terminal pins 18 in the punch-and-die mechanism 28-1, while simultaneously pulling additional terminal pins from the terminal pin strip 16 through a guideway 42 and into a clamping position for the next cycle of operation. The motor 38 and the guideway 42 are mounted on an elevated platform 44 supported above a base 46 (FIG. 5) by sidewalls 48 (FIG. 5) suitably secured to the platform and the base. Similarly, the associated supply reel 24-1 is rotatably mounted at the upper end of a stand 49 secured at its lower end to the platform 44.

Referring to FIGS. 5, 6 and 7, the clamping mechanism 34 of the shuttle mechanism 36 is mounted on a Y-slide 50 of the shuttle mechanism. The Y-slide 50 is slidably supported for horizontal reciprocable movement on an X-slide 52 (FIGS. 5 and 6) of the shuttle mechanism 36 in a known manner by depending brackets 54 (FIG. 7) which slidably receive guide rods 56 fixedly supported at their opposite ends in upstanding brackets 58 (FIGS. 5, 6 and 7) on the X-slide. The Y-slide 50 is reciprocated by a reversible indexing motor 60 (FIGS. 5 and 6) mounted on the X-slide 52, and a drive screw 62 (FIGS. 6 and 7) which extends through a drive bushing (not shown) in one of the depending brackets 54 (FIG. 7) on the Y-slide 50 and which is rotatably supported at an outer free end in an upstanding bracket 59 (FIG. 7) on the X-slide.

The X-slide 52 (FIGS. 5 and 6) of the shuttle mechanism 36 is slidably supported for horizontal reciprocable movement on a pair of spaced elongated guide rods 64 supported at their opposite ends in upstanding brackets 66 on the platform 44. The drive motor 38 also is mounted on the platform 44 and its associated drive screw 40 extends through an aperture in the adjacent bracket 66, and through a screw threaded drive bushing (not shown) in one of a plurality of depending legs 67 (FIG. 5) of the X-slide 52, with an end of the drive screw remote from the motor journalled in an upstanding bracket 68 secured at its lower end to the platform.

As is illustrated in FIGS. 7 and 9, after a set of the terminal pins 18 has been advanced into the punch-and-die mechanism 28-1 by the pin transporter mechanism 26-1, the punch-and-die mechanism severs the webs 22 between each adjacent pair of the terminal pins. The terminal pins 18 then are held individually in fixed spaced relationship by the clamping mechanism 34 (FIG. 7) on the shuttle mechanism 36.

Figure 10:
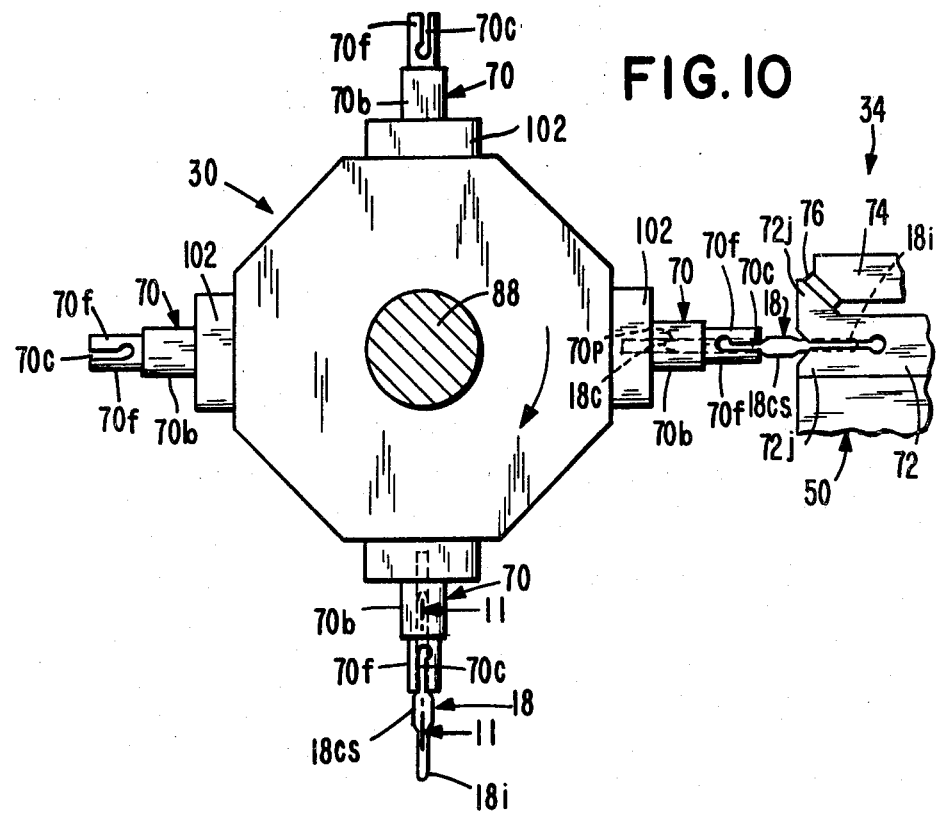
FIG. 10 is an enlarged cross-sectional view of a portion of the apparatus taken along the line 10—10 in FIG. 5.

The shuttle mechanism 36 next is driven by the X-slide motor 38 further to the right as viewed in FIGS. 5 and 6, to a position directly opposite (in front of) one of a plurality of clamping mechanisms 70 on the rotatable turret 30, whereupon the X-slide motor is de-energized. The Y-slide drive motor 60 then is energized to move the Y-slide 50, including the clamping mechanism 34 and the terminal pins 18 clamped therein, toward the opposed clamping mechanism 70 on the rotatable turret 30. Referring to FIG. 10, this movement of the shuttle clamping mechanism 34 then causes the connector ends 18c and the intermediate blade-type orienting portions 18b of the terminals 18 to be received in the turret clamping mechanism 70.

The shuttle clamping mechanism 34 then releases from the set of terminal pins 18 and the Y-slide drive motor 60 (FIGS. 5 and 6) is energized in a reverse direction to withdraw the Y-slide 50 and the clamping mechanism from the pins, leaving the pins held clamped in the clamping mechanism 70 on the rotatable turret 30. The drive motor 60 continues to cause retraction of the clamping mechanism 34 until it has reached a position as illustrated by broken lines in FIG. 6, which is outside its initial line of travel for advancing the terminal pins 18 to the right in this figure. The drive motor 60 then is de-energized and the X-slide drive motor 38 is energized in a reverse direction to drive the shuttle mechanism 36 to the left in FIGS. 5 and 6 until the clamping mechanism 34 is opposite (in front of) a new leading set of the terminal pins 18 of the terminal strip 16. The X-slide drive motor 38 now is de-energized and the Y-slide drive motor 60 again is energized to advance the Y-slide 50 and the clamping mechanism 34 toward the new leading set of terminal pins 18 so that these terminal pins can be clamped by the clamping mechanism as illustrated in FIG. 7.

Referring to FIG. 7, the shuttle clamping mechanism 34 includes a clamping member 72 fixedly mounted on the top of the Y-slide 50 at the lefthand end thereof as viewed in this figure. The clamping member 72 includes integral horizontally spaced upper resilient jaws 72j separated by vertical slots 72a (FIG. 8). Each of the upper clamping jaws 72j also is separated from an opposed lower fixed clamping jaw 72j by a slot 72b which terminates at an inner end in an enlarged circular portion 72c (FIG. 7) to increase the resiliency of the upper jaws in a known manner. As is best shown in FIG. 8, the opposed clamping jaws 72j also include elongated opposed slots 72d for the reception of the insertion ends 18i of the terminal pins 18.

Flexing of the upper resilient clamping jaws 72j of the clamping mechanism 34 toward the lower clamping jaw 72j to clamp the insertion ends 18i of the terminal pins 18 lightly between the upper jaws and the lower jaw so as to confine the pins against movement, is accomplished by a mechanism which includes an elongated bar member 74 pivoted intermediate its ends on the top of the Y-slide 50. As is best shown in FIG. 6, the bar member 74 includes a fan-shaped clamping portion 74f and an elongated handle portion 74h. At the lefthand end of the fan-shaped portion 74f of the operating bar 74, as viewed in FIG. 7, the operating bar is suitably bonded to an elongated resilient pad 76, which also is suitably bonded to the upper clamping jaws 72j and which is formed of a suitable resilient material, such as rubber.

At the opposite end of the operating bar 74 in FIG. 7, the handle portion 74h thereof is connected to an actuating air cylinder 78 mounted on the top of the Y-slide 50. When the air cylinder 78 is operated to pivot the operating bar 74 in a counterclockwise direction as viewed in FIG. 7, the upper resilient clamping jaws 72j are flexed toward the lower fixed clamping jaws 72j a slight amount, such as 10 mils, to clamp the insertion ends 18i of the terminal pins 18 between the jaws as shown in FIG. 8. When the air cylinder 78 is de-energized to pivot the operating bar 74 in a reverse clockwise direction as viewed in FIG. 7, the resilient upper clamping jaws 72j return to their initial positions with respect to the lower fixed clamping jaw 72j to release the terminal pins 18.

The punch-and-die mechanism 28-1 includes a lower fixed die member 80 (FIG. 7) and an upper vertically movable punch member 82 (FIG. 7) having a plurality of spaced depending punch elements 84 (FIGS. 7 and 9). When each set of the terminal pins 18 has been located between the punch-and-die members 80 and 82 by the associated pin-transporter mechanism 26-1, the punch member is operated vertically downward and the punch elements 84 sever the webs 22 (FIG. 1) between adjacent pairs of the terminal pins, from the terminal pins, as illustrated in FIG. 9. The web-severing operation inherently forms slightly projecting (e.g., 3 mils) ears 18e on the terminal pins, and the resultant severed web portions 22p (one shown in dashed lines in FIG. 7) then drop downward through a suitable discharge chute in the die member 80 to a discharge receptacle (not shown)

As is best shown in FIG. 5, the rotatable turret 30 is fixedly mounted on a horizontal shaft 88 rotatably mounted in the lower ends of a pair of depending brackets 90 suitably secured at their upper ends to a support plate 92. The support plate 92 is mounted at opposite ends on the upper ends of a pair of upstanding support posts 94 suitably secured at their lower ends to the platform 44. As is shown in FIG. 6, the lefthand end of the support shaft 88 is connected through a suitable drive clutch 96 and a drive chain 98 to an indexing drive motor 100 mounted on the platform 44.

Referring to FIG. 10, the terminal pin clamping mechanism 70 on the rotatable turret 30 are suitably mounted on support blocks 102 on the turret at 90° intervals. Each turret clamping mechanism 70 may be in the form of an elongated plate member having a base portion 70b and a plurality of spaced parallel sets of opposed resilient clamping fingers 70f defined by an elongated slot 70c in the plate member and a plurality of laterally spaced slots 70d (FIGS. 11 and 12) between the resilient fingers.

Figure 11:
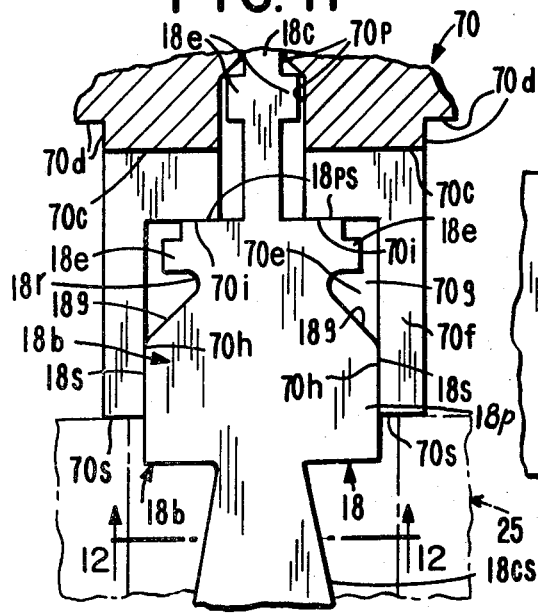
FIG. 11 is a cross-sectional view taken along the line 11—11 in FIG. 10.
Figure 12:
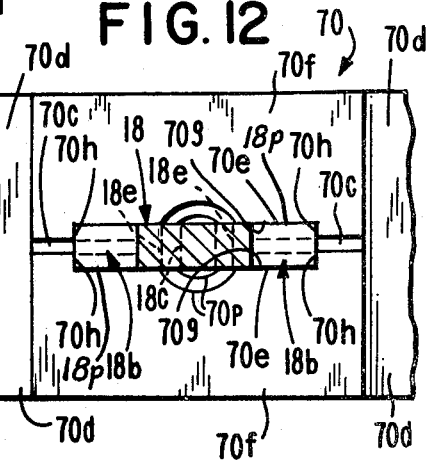
FIG. 12 is a cross-sectional view taken along the line 12—12 in FIG. 11.

Each pair of the opposed resilient clamping fingers 70f includes opposed slots 70e (FIGS. 11 and 12) for receiving the blade-type orienting portion 18b of one of the terminal pins 18 so as to confine the pin against movement, with the connector end 18c of the pin extending into a circular passageway 70p in the clamping mechanism 70 as illustrated in FIGS. 10, 11 and 12. In this connection, during the reception of the terminal pin 18 in the clamping fingers 70f, the inclined guide surfaces 18g of the pin, which project laterally beyond the adjacent ears 18e, the opposite planar side surfaces of the free connector end 18c, and the intermediate push shoulders 18ps, insure centering of the pin in the clamping finger slots 70e. Inner surfaces 70g and 70h of the clamping finger slots 70e then engage the planar surfaces 18p and the side edges 18s, respectively, of the blade portion 18b of the terminal pin 18, to further confine the pin against movement and to insure proper orientation of the pin during the subsequent insertion of the pin into the printed wiring board 20. Further, inner surfaces 70i (FIG. 11) of the slots 70e in the resilient fingers 70f engage the intermediate push shoulders 18ps of the terminal pin 18, which project laterally beyond respective ones of the opposite planar side surfaces of the free connector end 18c, for exerting a pushing force on the pin during the pin insertion operation.

As is shown in FIGS. 11 and 12, the circular passageway 70p includes first and second sections of different diameters for receiving the connector end 18c of the terminal pin 18 and an adjacent pair of the projecting ears 18e of the pin, respectively, with the planar side surfaces of the connector end spaced from the inner walls of the passageway as shown in FIG. 11. Preferably, however, the diameters of the passageway 70p are chosen so that the edges of a main portion of the connector end 18c of the terminal pin 18 and of the ears 18e of the pin are received in the passageway in closely spaced relationship, as illustrated in FIG. 12, to confine the terminal pin against lateral movement without damage to the planar side surfaces of the connector end.

Insertion of the terminal pins 18 received in each clamping mechanism 70 of the turret 30, into the respective ones of the apertures 20a (FIG. 2) in the printed wiring board 20 (FIGS. 2 and 5), is accomplished by indexing the turret 30 through 90° to a vertical position, as shown in FIG 5. The printed wiring board 20 then is moved vertically upward so that the insertion ends 18i of the terminal pins 18 pass through respective ones of the slots 25s in the plastic guide plate 25 and through the apertures 20a in the printed wiring board until the compliant sections 18cs of the pins are received in the printed wiring board apertures with a force fit, as shown in FIG. 2. During this insertion operation, the inner surfaces 70i (FIG. 11) of the resilient turret clamping fingers 70f exert pressure on the push shoulders 18ps of the terminal pins 18 to force the pins into the apertures 20a (FIG. 2) in the printed wiring board without damaging the connector ends 18c of the pins. The terminal pins 18 are inserted into the printed wiring board apertures 20a (FIG. 2) until the plastic guide plate 25 engages outer stop surfaces 70s of the clamping fingers 70f as illustrated in FIG. 11, whereby the terminal pins are inserted into the printed wiring board 20 (FIG. 2) to a desired uniform depth. Then, since the friction force between the compliant sections 18cs of the terminal pins 18 and the walls of the apertures 20a in the printed wiring board 20 is greater than the gripping power of the clamping fingers 70f on the turret 30, when the printed wiring board is moved vertically downward the terminal pins are pulled by the printed wiring board from the clamping fingers.

The printed wiring board 20 and the guide plate 25 are supported on a table 104 (FIGS. 5 and 6) in any suitable manner, not shown. The table 104 is fixedly mounted on a Y-slide 106 of the X, Y, Z traversing system 32. The Y-slide 106 is slidably mounted for horizontal movement along a guideway of an X-slide 108 and is driven by a motor 110 (FIG. 6) mounted on the X-slide and connected to the Y-slide by a drive screw 112. The X-slide 108 is mounted for horizontal movement along a guideway of a vertically movable platform 114, and is driven by a motor 116 mounted on the platform and connected to the X-slide by a drive screw 118. The platform 114 is vertically movable by four air cylinders 120 located adjacent the corners of the platform and mounted on the base plate 46, and is supported for vertical movement by suitable guide bushings and vertical guide rods 121 extending between the platform 44 and the base plate.

After one set of the terminal pins 18 has been inserted in the printed wiring board 20 from the supply reel 24-1 as above described, the Y-slide 106 and/or the X-slide 108 of the X, Y, Z traversing system 32 are indexed horizontally to locate a new set of the apertures 20a in the printed wiring board in position for reception of a set of the terminal pins 18. A next set of the terminal pins 18, from the supply reel 24-2 (righthand side of FIGS. 5 and 6), then is inserted into the positioned printed wiring board apertures 20a in a manner as above described. Subsequently, another set of the terminal pins 18 from the supply reel 24-1 is inserted into the printed wiring board 20, with sets of the terminal pins being alternately inserted into the printed wiring board from the supply reels 24-1 and 24-2 until a desired array of the pins has been inserted into the board.

INDUSTRIAL APPLICATION

In summary, the intermediate-web held terminal pins 18 (FIG. 1) or 18' (FIG. 3) readily can be assembled with a support structure, such as the printed wiring board 20 (FIG. 2) or 20' (FIG. 4) without disturbing the integrity of the smooth finished surfaces of the connector ends 18c or 18c' of the pins. This is accomplished by initially severing the intermediate webs 22 or 22' to separate the terminal pins 18 or 18', respectively, as illustrated in FIGS. 7 and 9 for the terminal pins 18. Since the intermediate webs 22 or 22' are not connected to the connector ends 18c or 18c', this severing operation has no effect on the integrity of the connector ends. Subsequently, pressure is exerted on the push shoulders 18ps or 18ps' of the pins 18 or 18', respectively, as illustrated in FIG. 11 for the terminal pins 18, to insert the pins into the printed wiring board 20 or 20' without engaging and damaging the connector ends of the pins.

In the disclosed method and apparatus in accordance with the invention, and with reference to the insertion of the terminal pins 18 of FIG. 1 into the apertures 20a (FIG. 2) of the printed wiring board 20 (FIG. 2) by way of example, sets of the terminal pins are alternately inserted into the printed wiring board apertures from the supply reels 24-1 and 24-2 (FIGS. 5 and 6). By way of illustration, referring to the lefthand sides of FIGS. 5 and 6, the insertion ends 18i (FIG. 1) of a set of the terminal pins 18 extending from the supply reel 24-1 initially are clamped by the clamping mechanism 34 (best shown in FIG. 7) of the pin transporter mechanism 26-1. The X-slide 52 of the shuttle mechanism 36 of the pin transporter mechanism 26-1 then is driven to the right in FIGS. 5 and 6 so that the clamping mechanism 34 positions the clamped set of terminal pins 18 in the punch-and-die mechanism 28-1, while drawing a new set of the pins from the supply reel 24-1 into a clamping position. The webs 22 between the clamped set of terminal pins 18 then are severed from the pins by the punch-and-die mechanism 28-1 as illustrated in FIG. 9, whereupon the pins are retained individually in spaced relationship by the clamping mechanism 34.

The X-slide 52 then is driven further to the right in FIGS. 5 and 6 to locate the clamped set of terminal pins 18 in opposed alignment with one of the clamping mechanisms 70 on the rotatable turret 30. The Y-slide 50 of the shuttle mechanism 36 then is driven toward the turret 30 to insert the connector ends 18c of the clamped terminal pins 18 in the resilient clamping fingers 70f of the clamping mechanism 70 as illustrated in FIGS. 10, 11 and 12. The clamping mechanism 34 on the Y-slide 50 then is deactuated to release the insertion ends 18i of the terminal pins 18 and the Y-slide is retracted to withdraw the clamping mechanism from the pins so that the pins are retained individually in spaced relationship by the clamping fingers 70f. The Y-slide 50 and the X-slide 52 of the shuttle mechanism 36 then are operated to locate the clamping mechanism 34 in position for clamping the next set of the terminal pins 18 extending from the supply reel 24-1.

After one of the sets of the terminal pins 18 has been inserted in the clamping mechanism 70 on the turret 30 as above described, the turret is rotated 90° to position the terminal pins in vertical alignment with a respective set of the apertures 20a in the printed wiring board 20, as shown in FIG. 5. The printed wiring board 20 then is moved upward by the X, Y, Z traversing system 32 so that the insertion ends 18i of the terminals 18 pass through their respective slots 25s in the guide plate 25 and their respective apertures 20a in the printed wiring board, and so that the compliant sections 18cs of the pins are received in the printed wiring board apertures with a force fit, as shown in FIG. 2.

Referring to FIG. 11, during the pin insertion process the inner surfaces 70i of the clamping mechanism 70 on the turret 30 exert pressure on the push shoulders 18ps of the terminal pins 18 and the outer stop surfaces 70s of the clamping mechanism engage the guide plate 25, to achieve the desired insertion of the pins into the apertures 20a (FIG. 2) of the printed wiring board 20 to a uniform depth. Further, during the pin insertion process the inner surfaces 70g and 70h of the clamping mechanism 70 engage the planar surfaces 18p and the side edges 18s, respectively, of the terminal pins 18 to orient the pins and to confine the pins against movement. At the same time the edges of the connector ends 18c of the terminal pins 18 and the edges of the adjacent projecting ears 18e of the pins cooperate with the inner walls of the circular passageway 70p of the clamping mechanism, as illustrated in FIG. 12, so as to confine the pins against movement without damage to the planar side surfaces of the connector ends of the pins.

Subsequently, when the printed wiring board 20 is lowered to its initial position by the X, Y, Z traversing system 32, the terminal pins 18 are pulled from the clamping fingers 70f by the printed wiring board. The printed wiring board 20 then is indexed by operation of the X, Y, Z traversing mechanism 32 to locate a next set of the apertures 20a in the terminal pin-receiving position, and a set of the terminal pins from the supply reel 24-2 is inserted therein. This procedure, of alternately inserting sets of the terminal pins 18 in the printed wiring board apertures 20a from the supply reels 24-1 and 24-2, then is repeated until the desired array of pins has been inserted in the printed wiring board 20.

What is claimed is:

1. A method of assembling terminal pins with a support structure where each pin is formed with a free insertion end to be inserted into one of a plurality of apertures in the support structure, and a free connector end for ultimate assembly with a connector, and where the pins are held in a strip by webs formed integrally with and between intermediate portions of adjacent pins, which comprises the steps of:

positioning the free insertion end of each of a plurality of the terminal pins of the strip into a movement-confining portion of a pin transporter;

removing each of the webs between the intermediate portions of adjacent pairs of the terminal pins positioned in the pin transporter so that the pins are retained individually in spaced relationship by their respective movement-confining portions of the pin transporter;

moving the pin transporter toward a pin inserter after the webs have been severed from the intermediate portions of the terminal pins, to position the intermediate portion of each terminal pin in the pin transporter into a movement-confining portion of the pin inserter;

withdrawing the pin transporter from the free insertion ends of the terminal pins so that the pins are retained individually in the pin inserter in spaced relationship by the movement-confining portions of the pin inserter; and causing relative movement between the pin inserter and a support structure to insert the free insertion end of each terminal pin retained in the pin inserter into one of the apertures of the support structure.

2. A method of assembling terminal pins with a support structure where each pin is formed with a free insertion end to be inserted into one of a plurality of apertures in the support structure, and a free connector end for ultimate assembly with a connector, and where the pins are held in a strip by webs formed integrally with and between intermediate portions of adjacent pins, which comprises the steps of:

clamping the free insertion end of each of a plurality of the terminal pins of the strip in a first clamping position;

removing each of the webs between the intermediate portions of adjacent pairs of the clamped terminal pins;

moving the clamped terminal pins to a second clamping position after the webs have been severed from the intermediate portions of the pins;

clamping the intermediate portions of the terminal pins in the second clamping position;

releasing the free insertion ends of the terminal pins in the second clamping position so that the pins are retained individually in spaced relationship by the clamping of the intermediate portions of the pins; and causing relative movement between the terminal pins and a support structure after the intermediate portions of the pins have been clamped and the free insertion ends of the pins have been released, to insert the free insertion end of each terminal pin into one of the apertures of the support structure.

3. A method as recited in claim 2, in which:

portions of the pin inserter are engaged with push shoulders on the terminal pins intermediate the insertion ends and the connector ends of the pins to insert the insertion end of each pin into one of the apertures of the support structure.

4. A method as recited in claim 3, which further comprises the preliminary step of:

forming openings in the webs adjacent the terminal pins to define the push shoulders on the terminal pins and to reduce the cross-sectional area of the webs adjacent the terminal pins to facilitate subsequent removal of the webs between adjacent pairs of the pins.

5. Apparatus for assembling terminal pins with a support structure where each pin is formed with a free insertion end to be inserted into one of a plurality of apertures in the support structure, and a free connector end for ultimate assembly with a connector, and where the pins are held in a strip by webs formed integrally with and between intermediate portions of adjacent pins, which comprises:

first clamping means for releasably clamping the free insertion ends of a plurality of the terminal pins means for severing the webs between the intermediate portions of the terminal pins being clamped by the first clamping means;

second clamping means for releasably clamping the intermediate portions of the terminal pins after the webs have been severed from the intermediate portions of the terminal pins by the web severing means;

means, including the first clamping means, for transporting the clamped terminal pins from the web severing means to the second clamping means;

means for causing the first clamping means to release the free insertion ends of the terminal pins after the intermediate portions of the pins have been clamped by the second clamping means; and means for causing relative movement between the support structure and the second clamping means to insert the free insertion ends of the pins into respective ones of the apertures in the support structure.

6. Apparatus as recited in claim 5, in which:

the web severing means is a punch-and-die mechanism; and the pin transporting means includes a shuttle means movable in directions perpendicular to one another, for advancing the terminal pins from a continuous supply into the punch-and-die mechanism, and for positioning the intermediate portions of the terminal pins in the second clamping means.

7. Apparatus as recited in claim 5, in which the second clamping means includes:

a turret rotatable between a terminal pin-receiving position for receiving pins from the pin transporting means, and a terminal pin-inserting position for inserting pins into the support structure; and terminal pin clamping fingers mounted on the turret for receiving the intermediate portions of the terminal pins.

8. Apparatus as recited in claim 7, which further comprises:

means for causing relative movement between the turret and the support structure in a direction radially of the axis of rotation of the turret to insert the insertion ends of the terminal pins in the turret into the apertures in the support structure.

9. Apparatus as recited in claim 7, in which the terminal pins include push shoulders intermediate the insertion ends and the connector ends of the pins, and in which:

the terminal pin clamping fingers include surfaces engageable with the push shoulders on the terminal pins to insert the insertion ends of the pins into the apertures in the support structure.

10. Apparatus as recited in claim 5, in which:

the first clamping means includes a clamping member having a fixed clamping jaws and integral resilient jaws operable by a clamping bar for simultaneously clamping the terminal pins in the jaws.

* * * * *

UNITED STATES PATENT AND TRADEMARK OFFICE
CERTIFICATE OF CORRECTION

PATENT NO. : 4,365,398
DATED : December 28, 1982
INVENTOR(S) : William Martin Chisholm It is certified that error appears in the above-identified patent and that said Letters Patent are hereby corrected as shown below:

In the specification, Column 1, line 65 change "rails" to read --rail--. Column 2, line 46 change "puch" to read --push--. Column 3, line 42 after "side" insert --surfaces--. Column 4, line 44 change "22c" to --22o--. Column 4, line 48 change "puch" to read --push--. Column 6, line 52 change "jaws" to read --jaw--. Column 7, line 10 change "jaws" to read --jaw--; and line 35 after "(not shown)" insert a period --.--.

In the claims, Column 12, line 65 change "jaws" to read --jaw--.

Signed and Sealed this

Third Day of May 1983

[SEAL]

Attest:

Attesting Officer

GERALD J. MOSSINGHOFF

Commissioner of Patents and Trademarks